(12) United States Patent
Kasahara et al.

(10) Patent No.: US 8,048,591 B2
(45) Date of Patent: Nov. 1, 2011

(54) MASK BLANK GLASS SUBSTRATE, MASK BLANK GLASS SUBSTRATE MANUFACTURING METHOD, MASK BLANK MANUFACTURING METHOD, AND MASK MANUFACTURING METHOD

(75) Inventors: Hisashi Kasahara, Shinjuku-ku (JP); Yasushi Okubo, Shinjuku-ku (JP)

(73) Assignee: Hoya Corporation, Tokyo (JP)

( * ) Notice: Subject to any disclaimer, the term of this patent is extended or adjusted under 35 U.S.C. 154(b) by 27 days.

(21) Appl. No.: 12/486,106

(22) Filed: Jun. 17, 2009

(65) Prior Publication Data

US 2009/0317729 A1 Dec. 24, 2009

(30) Foreign Application Priority Data

Jun. 18, 2008 (JP) .................. 2008-158765

(51) Int. Cl.
*G03F 1/00* (2006.01)
(52) U.S. Cl. .......................................................... 430/5
(58) Field of Classification Search ............... 430/5, 22, 430/322, 323, 324; 428/428, 430
See application file for complete search history.

(56) References Cited

U.S. PATENT DOCUMENTS

| | | | |
|---|---|---|---|
| 7,510,124 B2 * | 3/2009 | Barker et al. ................. | 235/494 |
| 2001/0028385 A1 | 10/2001 | Hayashi | |
| 2006/0246361 A1 | 11/2006 | Kurikawa et al. | |
| 2007/0075059 A1 | 4/2007 | Arai | |

FOREIGN PATENT DOCUMENTS

| | | | |
|---|---|---|---|
| JP | 59015938 | A | 1/1984 |
| JP | 9122940 | A | 5/1997 |
| JP | 10291840 | A | 11/1998 |
| JP | 11267861 | A | 10/1999 |
| JP | 2002-116533 | A | 4/2002 |
| JP | 2006-309143 | A | 11/2006 |
| JP | 2007033857 | A | 2/2007 |
| JP | 200752162 | A | 3/2007 |
| JP | 2007079353 | A | 3/2007 |
| JP | 2007118079 | A | 5/2007 |
| WO | 2005/079470 | A2 | 9/2005 |

OTHER PUBLICATIONS

Japanese Office Action corresponding to Japanese Patent Application No. 2008158765, dated Apr. 20, 2010.

* cited by examiner

*Primary Examiner* — Stephen Rosasco
(74) *Attorney, Agent, or Firm* — Sughrue Mion, PLLC

(57) ABSTRACT

A mask blank glass substrate is for use in manufacturing a mask blank. In the mask blank glass substrate, a marker expressing, by a plurality of pits, information for identifying or managing the mask blank glass substrate is formed on a surface of a region, having no influence on formation of a transfer pattern, of the mask blank glass substrate. Each of the pits forming the marker is a round hole with its edge portion being generally circular and a distance L1 between the edge portions of the adjacent pits is 50 μm or more. The marker is formed, for example, on an end face of the mask blank glass substrate.

12 Claims, 5 Drawing Sheets

MASK BLANK GLASS SUBSTRATE, MASK BLANK GLASS SUBSTRATE MANUFACTURING METHOD, MASK BLANK MANUFACTURING METHOD, AND MASK MANUFACTURING METHOD

This application is based upon and claims the benefit of priority from Japanese Patent Application No. 2008-158765, filed on Jun. 18, 2008, the disclosure of which is incorporated herein in its entirety by reference.

TECHNICAL FIELD

This invention relates to a glass substrate for a mask blank (hereinafter referred to as a "mask blank glass substrate"), a mask blank glass substrate manufacturing method, a mask blank manufacturing method, and a mask manufacturing method.

BACKGROUND ART

A structure is known in which a marker for identification or management is formed on a mask blank glass substrate for use in the manufacture of a mask blank (see, e.g. Japanese Unexamined Patent Application Publication (JP-A) No. 2006-309143 (Patent Document 1) corresp. to US2006/0246361A1). This marker is expressed by an array of pits. The pits are formed by laser light irradiation on a surface of a region, having no influence on formation of a transfer pattern, of a mask blank glass substrate, for example, on a main surface in a peripheral region outside a region where a transfer pattern is formed in a mask blank fabricated by forming a transfer pattern thin film on the mask blank glass substrate, on an end face, on a chamfered surface formed between the main surface and the end face, or on a notch mark forming portion.

DISCLOSURE OF THE INVENTION

In recent years, the wavelength of an exposure light source for use in a photolithography process in the manufacture of semiconductor devices or the like has been reduced to 200 nm or less and, therefore, the quality required for a mask blank for use in the manufacture of a mask and a mask blank glass substrate has become higher and higher. Particularly, the requirement for quality that affects pattern characteristics of devices to be manufactured, such as the allowable size of a defect, the allowable number of defects, or the in-plane thickness uniformity of a resist film, has become strict. For satisfying such quality requirements, it is necessary to sufficiently suppress the generation of dust from a mask blank glass substrate, for example.

However, when forming a marker on a mask blank glass substrate, there is a possibility that, depending on the shape of the marker or the manner of formation of the marker, dust is generated during the formation of the marker or in subsequent processes. Then, if the dust is generated during the formation of the marker or in the subsequent processes, there is a possibility that it becomes difficult to satisfy the quality required for a mask blank or a mask blank glass substrate.

It is therefore an object of this invention to provide a mask blank glass substrate, a mask blank glass substrate manufacturing method, a mask blank manufacturing method, and a mask manufacturing method that can solve the above-mentioned problem.

The inventors of this application have assiduously studied the relationship between a marker formed on a mask blank glass substrate and the generation of dust. Then, the inventors have first considered to suppress the generation of dust by forming each pit of a marker into a round hole and thus forming the marker expressed by an array of the round holes, thereby obtaining the marker with no corners of the pits.

However, as a result of a further study, the inventors have found that even if a marker is formed with its pits in the form of round holes, cracks, chips, or the like tend to occur during the formation of the marker or in subsequent processes depending on the arrangement of the round holes and so on and thus it is difficult to sufficiently suppress the generation of dust. Based on this knowledge, the inventors have reached this invention that can more properly suppress the generation of dust. This invention has the following structures.

(Structure 1)

A mask blank glass substrate for use in manufacturing a mask blank, wherein:

a marker expressing, by a plurality of pits, information for identifying or managing the mask blank glass substrate is formed on a surface of a region, having no influence on formation of a transfer pattern, of the mask blank glass substrate, each of the pits forming the marker is a round hole with its edge portion being generally circular, and a distance between the edge portions of the adjacent pits is 50 μm or more.

The distance between the edge portions of the adjacent pits is, for example, 50 to 170 μm, preferably 70 to 150 μm.

When forming a marker by an array of round holes, if the distance between the adjacent round holes, i.e. pits, is small, there is a possibility that the width of portions each between the adjacent pits becomes small to weaken the strength of those portions. As a result, there is a possibility that cracks, chips, or the like occur at the portions between the adjacent pits, for example, due to shock or the like received during the formation of the marker or in subsequent processes, thus causing the generation of dust. Particularly, in the case of forming the marker by melting or sublimating part of a surface of a glass substrate by irradiation of energy light such as laser light, a raised portion is formed around the edge of each pit (see FIGS. 2A to 2C). When removing these raised portions by polishing, if the distance between the adjacent pits is small and thus the strength therebetween is low, cracks, chips, or the like particularly tend to occur due to forces applied during the polishing. Further, if cracks, chips, or the like occur at such portions, those cannot be removed even by polishing or the like and thus the possibility increases that the accuracy of a mask blank or a mask formed later will be adversely affected.

Further, when the distance between the adjacent pits is set small, there is also a possibility that the adjacent pits are joined together due to variation in process accuracy or the like during the formation of the marker. If the adjacent pits in the form of the round holes are joined together, a pit formed by the joined round holes has, for example, a generally gourd shape in which two circles partially overlap each other with a convex portion at the boundary therebetween. In this case, this convex portion tends to be subjected to cracks, chips, or the like and thus there is a possibility of causing the generation of dust.

In contrast, according to Structure 1, the strength of portions each between the adjacent pits can be ensured by setting the distance between the adjacent pits to the predetermined value or more. Therefore, with this structure, it is possible to properly prevent the occurrence of cracks, chips, or the like due to shock or the like received during the formation of the marker or in subsequent processes, for example. This makes it possible to properly prevent the pits forming the marker from causing the generation of dust. Thus, it is possible to appropriately form the marker which hardly causes the generation of dust.

As the marker, use can be appropriately made of a two-dimensional code such as, for example, Data Matrix, QR code, SP code, VeriCode, MaxiCode, CP code, Codel, Aztec-Code, INTACTA Code, or Card-e. The marker is preferably formed in a region having no influence on pattern transfer at the time of using a mask manufactured from the mask blank glass substrate. In Structure 1, "a surface of a region, having no influence on formation of a transfer pattern, of the mask blank glass substrate" represents, for example, a main surface in a peripheral region outside a region where a transfer pattern is formed in a mask blank fabricated by forming a transfer pattern thin film on the mask blank glass substrate, an end face, a chamfered surface formed between the main surface and the end face, or a notch mark forming portion.

(Structure 2)

The marker is formed on an end face of the mask blank glass substrate. The end face is most suitable for forming the marker as "a surface of a region, having no influence on formation of a transfer pattern, of the mask blank glass substrate". When forming the marker in the peripheral region outside the transfer pattern region of the main surface of the glass substrate, it is necessary to polish and remove raised portions after the formation of the pits by a process that does not affect the main surface of the glass substrate. On the other hand, in the case of the chamfered surface or the notch mark forming portion, the area is small and thus it is difficult to express a lot of information.

(Structure 3)

The marker is a two-dimensional code in which cells having a cell size of 0.13 to 0.3 mm are arranged two-dimensionally and which indicates the information by forming the pits in predetermined cells, and a diameter of each pit at its edge portion is 80 to 250 μm.

The cell size of each cell is preferably 0.24 to 0.26 mm (e.g. 0.25 mm). The diameter of each pit at its edge portion is preferably 90 to 150 μm.

With this structure, it is possible to appropriately form the marker in the form of the two-dimensional code that is readable with high accuracy. Further, this makes it possible to appropriately form the easily readable marker while properly preventing the pits from causing the generation of dust.

(Structure 4)

Each pit has a depth of 4 to 50 μm. The depth of each pit is preferably 10 to 45 μm and more preferably 25 to 40 μm. Given that the diameter of each pit at its edge portion is L1 and the depth thereof is D, a ratio L1/D between them is, for example, 2 to 5, preferably 3 to 4.

In order to make the marker readable with high accuracy, it is necessary to make sufficiently large the difference in contrast between the presence and absence of the pit, for example, in an image of the marker photographed. Then, in order to enhance the contrast difference, it is considered to increase the diameter of the pits in the form of the round holes, for example. However, if the diameter of the pits is increased, the distance between the adjacent round holes decreases so that there is a possibility that cracks, chips, or the like tend to occur.

On the other hand, in order to enhance the contrast difference without changing the diameter of the pits, it is considered to increase the depth of the pits, for example. However, if the round holes each with a relatively small diameter and a relatively large depth are formed, there is a possibility that particles tend to be captured into the round holes in various processes and there is a possibility that the particles cannot be removed in a cleaning process after the formation of the round holes. If the particles are captured in the round holes, there is a possibility that the particles cause the generation of dust in subsequent processes.

In contrast, according to Structure 4, it is possible to form the round holes that make the contrast difference sufficiently large with an appropriate shape. This makes it possible to appropriately form the marker which hardly causes the generation of dust and is easily readable.

(Structure 5)

Each pit is the round hole with its depth gradually increasing from its edge portion toward a deepest portion at its center. The round hole is, for example, a hole having a generally V-shaped section taken along a plane parallel to its depth direction.

With this structure, it is possible to form the round holes each having a smooth surface without unnecessary convex portions or the like, for example. This makes it possible to more properly prevent the marker from causing the generation of dust.

(Structure 6)

A method of manufacturing a mask blank glass substrate for use in manufacturing a mask blank, the method comprising forming a marker expressed by an array of pits for identifying or managing the mask blank glass substrate, wherein each pit is a round hole with its edge portion being generally circular and a distance between the adjacent round holes is 50 μm or more. With this structure, it is possible to obtain the same effect as that of Structure 1, for example.

(Structure 7)

The marker is a two-dimensional code in which cells having a cell size of 0.13 to 0.3 mm are arranged two-dimensionally and which indicates the information by forming the pits in predetermined cells, and a diameter of each pit at its edge portion is 80 to 250 μm, the method comprising a laser irradiation step of using laser light having a diameter equal to or less than the diameter of the pit at its edge portion, and moving said laser light in orbital paths or in a spiral path about the center of the pit such that the orbital paths or portions of the spiral path overlap each other at least partially, thereby forming a dug-down portion which is to be the pit.

The diameter of the laser light in an effective region having energy enough to melt or sublimate the mask blank glass substrate (hereinafter simply referred to as the diameter of the laser light) is, for example, 0.04 to 0.25 mm, preferably 0.06 to 0.2 mm (e.g. 0.08 mm). In any case, however, it is equal to or less than the diameter of the pit at its edge portion to be formed.

The inventors of this application have found that, using such a method, it is possible to form the round hole having a preferable shape. This makes it possible to appropriately form the marker that hardly causes the generation of dust.

(Structure 8)

A method of manufacturing a mask blank for use in manufacturing a mask for photolithography, the method comprising:

preparing the mask blank glass substrate manufactured by the method according to claim 6 or 7, and forming a transfer pattern thin film on the mask blank glass substrate.

With this structure, it is possible to obtain the same effect as that of Structure 6 or 7, for example. This makes it possible to appropriately manufacture the mask blank satisfying the quality that is required when manufacturing a mask for short-wavelength exposure light, for example.

(Structure 9)

A method of manufacturing a mask for photolithography, the method comprising:

preparing the mask blank manufactured by the method according to claim 8, and patterning the transfer pattern thin film.

With this structure, it is possible to obtain the same effect as that of Structure 8, for example. This makes it possible to appropriately manufacture the mask suitable for use with exposure light having a short wavelength, for example.

For example, when forming a marker expressed by a plurality of pits on a mask blank glass substrate for identifying or managing it, if there is a vertex in a plan-view shape of an edge portion of each pit, there is a possibility that the strength of those portions is lowered, while, if the width of portions each between the adjacent pits is small, there is a possibility that the strength of those portions is lowered. There is a possibility that those weak portions are subjected to cracks, chips, or the like, for example, due to shock or the like received during the formation of the marker or in subsequent processes, thus causing the generation of dust.

Particularly, in the case of forming the marker by melting or sublimating part of a surface of the glass substrate by irradiation of energy light such as laser light, a raised portion is formed around the edge of each pit. It is necessary to remove these raised portions by polishing. In this event, cracks, chips, or the like particularly tend to occur at those weak portions due to forces applied during the polishing. If cracks, chips, or the like occur at such portions, those cannot be removed even by polishing or the like and thus the possibility increases that the accuracy of a mask blank or a mask formed later will be adversely affected.

According to this invention, by forming each of pits by a round hole with its edge portion having no vertex and being generally circular in a plan-view shape, it is possible to suppress lowering of the strength and, by setting the distance between the adjacent pits to a predetermined value or more, it is possible to suppress lowering of the strength of portions between the adjacent pits, thereby making it possible to provide a mask blank glass substrate that can suppress the generation of dust due to cracks, chips, or the like at a marker forming portion.

DESCRIPTION OF THE EXEMPLARY EMBODIMENT

Hereinbelow, an embodiment according to this invention will be described with reference to the drawings.

Figure 1A:
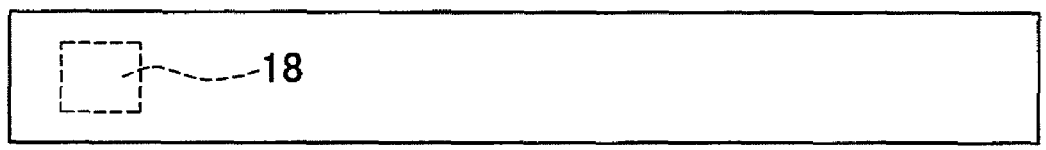
FIG. 1A is a side view showing an example of the structure of a glass substrate 12 according to an embodiment of this invention.
Figure 1B:
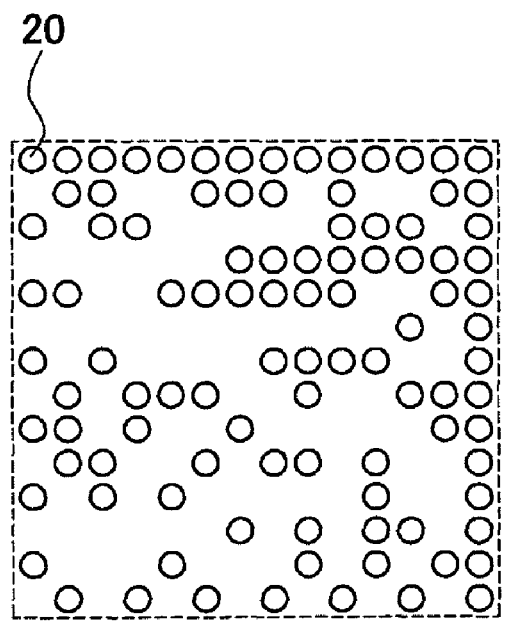
FIG. 1B shows an example of a detailed structure of a marker 18.

FIGS. 1A and 1B show an example of the structure of a glass substrate 12 according to the embodiment of this invention. FIG. 1A is a side view of the glass substrate 12. The glass substrate 12 is a mask blank glass substrate for use in the manufacture of a mask blank and is made of, for example, a synthetic quartz glass. The glass substrate 12 may alternatively be made of a $SiO_2$—$TiO_2$-based low thermal expansion glass, a crystallized glass with a β-quartz solid solution precipitated, a soda-lime glass, or the like. The glass substrate 12 has main surfaces and end faces (side surfaces and chamfered surfaces) that are each polished to a mirror surface with a predetermined surface roughness of, for example, 1 nm or less by arithmetic average surface roughness Ra. Further, in this example, the glass substrate 12 has, at a portion of the end face, a marker 18 which is formed for identifying or managing the glass substrate 12. By the use of the marker 18, the glass substrate 12 is one-by-one managed.

The mask blank manufactured from the glass substrate 12 is used for manufacturing a mask for photolithography. This mask is a light transmissive mask for an exposure light source with a wavelength of 200 nm or less, such as, for example, an ArF excimer laser (wavelength: 193 nm). The mask may alternatively be a reflective mask for extreme ultraviolet (EUV) exposure, which is used in reflective lithography using EUV light as a light source. The marker 18 may alternatively be formed at a portion other than the end face as long as no influence is exerted on transfer at the time of using the mask.

FIG. 1B shows an example of a detailed structure of the marker 18. The marker 18 is a two-dimensional code expressed by an array of hollows or pits 20. Each pit 20 is a round hole with its edge portion being generally circular in plan view. In this example, this two-dimensional code is a data matrix.

Herein, the marker 18 is mapped to various properties of the glass substrate 12, for example, in a glass substrate manufacturing process. As the properties mapped to the marker 18, shape information, defect information, and the like of the glass substrate 12 are considered, for example. Further, in manufacturing processes of a mask blank and a mask using the glass substrate 12, the marker 18 is mapped to various properties of the mask blank and the mask. As these properties, information indicating a type of a mask pattern thin film formed on the glass substrate 12, defect information thereof, and the like are considered, for example. By the use of various information mapped to markers 18, it is possible to carry out processes matching individual glass substrates 12 and individual mask blanks and masks manufactured from the glass substrates 12 while one-by-one managing those glass substrates 12, mask blanks, and masks, for example.

Figure 2A:
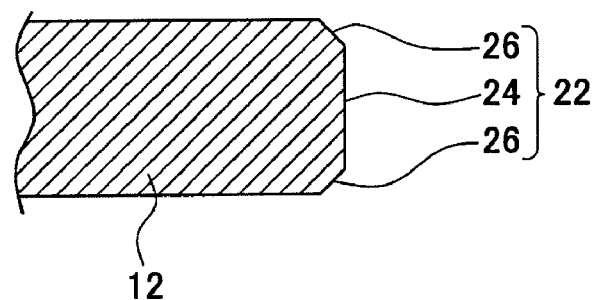
FIG. 2A shows the shape of an end face 22, where the marker 18 is formed, of the glass substrate 12.
Figure 2B:
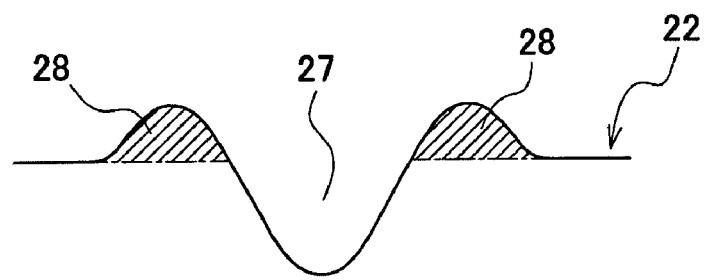
FIG. 2B shows an example of the shape of a dug-down portion 27 formed in a laser irradiation process.
Figure 2C:
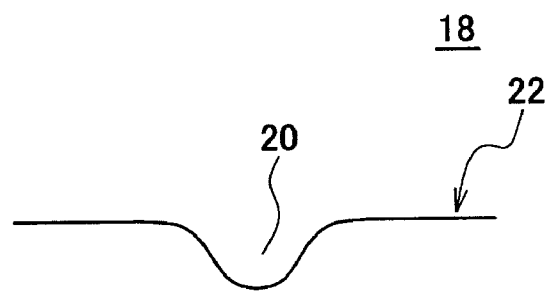
FIG. 2C shows an example of the shape of a pit 20 after an end face polishing process.

FIGS. 2A to 2C are diagrams for explaining an example of a method of manufacturing the glass substrate 12 formed with the marker 18. In this example, the manufacturing method of the glass substrate 12 comprises, for example, a substrate preparation process, a laser irradiation process, an end face polishing process, and a main surface polishing process. The substrate preparation process is, for example, a process of preparing a glass substrate ground to a predetermined shape.

The laser irradiation process is a process of irradiating laser light onto an end face of the glass substrate, thereby forming round holes to be the pits 20 of the marker 18. In this example, the laser irradiation process forms the round holes by irradiating laser light at positions to be formed with the pits 20 on the glass substrate, taking into account the influence of the end face polishing process to be subsequently performed. The end face polishing process is a process of polishing the end faces of the glass substrate to a predetermined surface roughness. On the other hand, the main surface polishing process is a process of polishing the main surfaces of the glass substrate to a predetermined surface roughness.

FIG. 2A shows the shape of an end face 22, where the marker 18 is formed, of the glass substrate 12. In this example, each end face 22 of the glass substrate 12 has a side surface 24 and a pair of chamfered surfaces 26. The side surface 24 is a surface perpendicular to the main surfaces of the glass substrate 12. Each chamfered surface 26 is an inclined surface connecting between the main surface of the glass substrate 12 and the side surface 24. In this example, the marker 18 is formed, for example, on the side surface 24 in one of the end faces 22 of the glass substrate 12.

FIG. 2B shows an example of the sectional shape of a dug-down portion 27 formed in the laser irradiation process. The shape of the dug-down portion 27 is only schematically illustrated for the sake of description. In this example, the laser irradiation process forms the dug-down portion 27 at a position corresponding to each of the pits 20 of the marker 18, for example, by the use of a laser marker adapted to irradiate carbon dioxide ($CO_2$) laser light.

In this case, a portion, irradiated with laser light, of the glass substrate 12 is melted or sublimated so as to be formed into the dug-down portion 27. Thus, the dug-down portion 27 can be appropriately formed. Simultaneously with the formation of the dug-down portion 27, a raised portion 28 is formed around the edge of the dug-down portion 27 such that the raised portion 28 has a shape that rises so as to surround the edge of the dug-down portion 27, for example. The laser irradiation process will be described in further detail later.

FIG. 2C shows an example of the shape of the pit 20 after the end face polishing process. The shape of the pit 20 is only schematically illustrated for the sake of description. In this example, the end face polishing process removes the raised portions 28 around the dug-down portions 27 by polishing the end face 22 of the glass substrate 12. Since the end face 22 is polished, the pit 20 becomes slightly shallower than the dug-down portion 27 corresponding to a polishing or machining allowance. Further, as a result thereof, the diameter of the pit 20 also becomes slightly smaller than the dug-down portion 27.

According to this example, the raised portions 28 around the dug-down portions 27 can be properly removed, for example, by the end face polishing process. Further, by forming the dug-down portions 27 with a larger diameter in advance in the laser irradiation process, the shape of the pits 20 after the end face polishing process can be a desired shape. Therefore, according to this example, the pits 20 with a preferable shape can be appropriately formed.

Figure 3A:
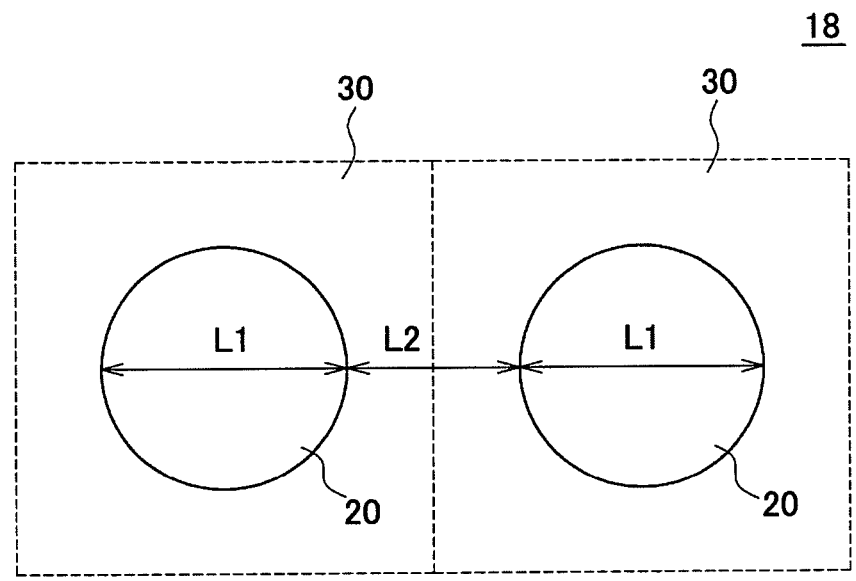
FIGS. 3A and 3B are a top view and a sectional view, respectively, each showing part of the marker 18, wherein an arrangement of adjacent two pits 20 is illustrated.
Figure 3B:
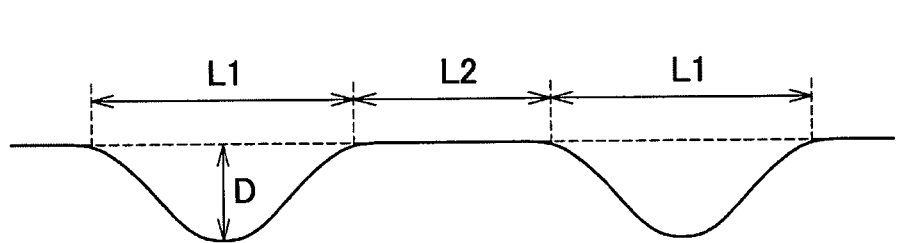

FIGS. 3A and 3B are diagrams for explaining the shape of the pits 20 in the marker 18 in further detail, wherein the marker 18 after the end face polishing process is partially illustrated. FIGS. 3A and 3B are a top view and a sectional view, respectively, each showing part of the marker 18, wherein an arrangement of the adjacent two pits 20 is illustrated. The section shown in FIG. 3B is a section taken along a plane parallel to a depth direction of the pits 20.

In this example, the marker 18 is a data matrix having a size of 1.56 to 4 mm square. In the marker 18, the pits 20 are formed in respective cells 30, virtually shown in broken lines, of the data matrix. The cell size of each cell 30 is, for example, 0.13 to 0.3 mm, preferably 0.24 to 0.26 mm. The cell size represents the length of one side of a square forming the cell 30.

Further, a diameter L1 of each pit 20 at its edge portion is, for example, 80 to 250 µm, preferably 90 to 150 µm. A distance L2 between the adjacent pits 20 is 50 µm or more and is, for example, 50 to 170 µm, preferably 70 to 150 µm. It is to be noted that the distance L2 between the adjacent pits 20 is, for example, the distance between the edge portions of the adjacent pits 20 in the case where these pits 20 are formed in both of the adjacent cells 30.

With this structure, the strength of a portion between the adjacent pits 20 can be achieved by sufficiently ensuring the distance between the adjacent pits 20, for example. Therefore, according to this example, it is possible to properly prevent the occurrence of cracks, chips, or the like due to shock or the like received in the end face polishing process carried out during the formation of the marker 18, the subsequent processes, or the like, for example. This makes it possible to properly prevent the pits 20 forming the marker 18 from causing the generation of dust. Thus, it is possible to appropriately form the marker 18 which hardly causes the generation of dust.

In this example, each pit 20 is a hole having a generally V-shaped section such that the depth gradually increases from an edge portion of an opening toward a deepest portion at the center. A depth D of each pit 20 is, for example, 4 to 50 µm, preferably 10 to 45 µm, and more preferably 25 to 40 µm. A ratio L1/D between the diameter L1 of the pit 20 at its edge portion and the depth D is, for example, 2 to 5, preferably 3 to 4.

With this structure, it is possible to sufficiently ensure a difference in contrast at the time of reading the marker 18 without excessively deepening the pits 20, i.e. with an appropriate shape thereof, for example. Further, a surface of each pit 20 forms a smooth shape without unnecessary convex portions or the like. Therefore, according to this example, it is possible to appropriately form the marker 18 which hardly causes the generation of dust and is easily readable.

Each pit 20 may be, for example, a hole with its opening being circular or elliptic. However, this opening is not necessarily strictly circular or elliptic, but may be substantially circular or elliptic according to required accuracy. Further, the diameter of the pit 20 at its edge portion is, for example, the diameter of a circumscribed circle of the edge portion. When the edge portion is circular, the diameter of the pit 20 at its edge portion is, for example, the diameter of a circle of the edge portion. When the edge portion is elliptic, the diameter of the pit 20 at its edge portion is, for example, the length of the major axis of an ellipse of the edge portion.

The edge portion of the pit 20 represents, for example, a closed curve connecting points located deeper by 1 µm than a portion, where the pit 20 is not formed, at an intermediate point between the adjacent two pits 20. This depth is the depth measured by, for example, an atomic force microscope (AFM). The distance between the pits 20 is, for example, the shortest distance between the edge portions of the adjacent two pits 20.

The depth D of the pit 20 is, for example, the depth of the deepest portion in the pit 20. The depth D is, for example, the depth using, as a reference, a portion, where the pit 20 is not formed, at an intermediate point between the adjacent two pits 20 and is measured by, for example, an atomic force microscope (AFM).

Figure 4A:
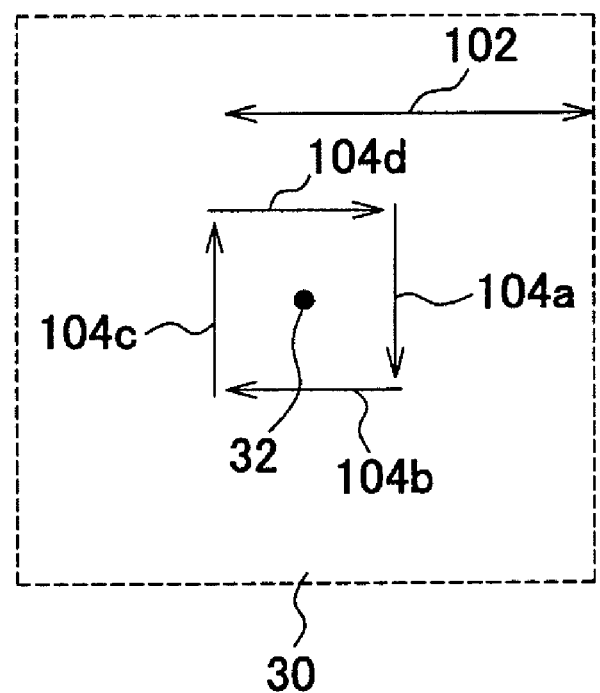
FIG. 4A shows an example of a laser light irradiation method.
Figure 4B:
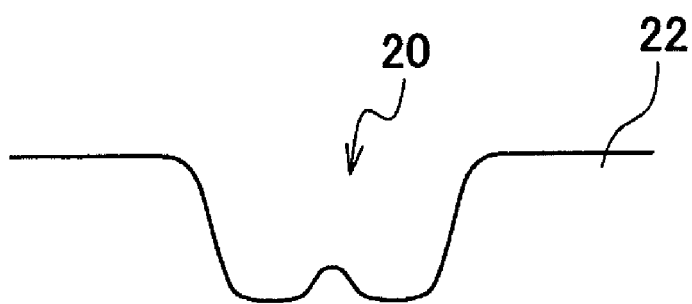
FIG. 4B shows an example of the sectional shape of a pit 20 formed when the printing line width is small.

FIGS. 4A and 4B are diagrams for explaining the laser irradiation process in further detail. FIG. 4A shows an example of a laser light irradiation method. In this example, the laser irradiation process irradiates carbon dioxide laser light having a diameter not greater than the cell size of the data matrix. In this example, the diameter (width) of the laser light shown in comparison with the cell size of the cell 30 is, for example, that indicated by an arrow 102. The diameter of the laser light is, for example, 0.04 to 0.25 mm, preferably 0.06 to 0.2 mm (e.g. 0.08 mm). In any case, however, it is equal to or less than the diameter of the pit 20 at its edge portion.

The laser marker irradiates laser light while automatically correcting it, thereby irradiating the laser light having a set diameter (width), for example. In this case, for example, the laser marker irradiates the laser light a plurality of times while shifting the optical axis in a width direction (direction of the arrow 102), thereby forming the dug-down portion 27 having a diameter (width) greater than that of the laser light. The diameter of the laser light is, for example, the width of a beam intensity at a $1/e^2$ (13.5%) level of a peak value measured in a plane perpendicular to the optical axis.

Using the laser light with the diameter thus set, the laser irradiation process forms each dug-down portion 27 (see FIG. 2B) by irradiating the laser light so as to orbit around the center 32 of the cell 30. In this manner, the laser irradiation process forms each dug-down portion 27 having a diameter slightly greater than that of the pit 20 to be formed.

The center 32 of the cell 30 is a position to be the center of the pit 20 to be formed. The laser irradiation process irradiates laser light in orbital paths so that the optical axis of the laser light moves, for example, along a course indicated by arrows 104a, 104b, 104c, and 104d, wherein the pitch of the orbital paths is set so that the orbital paths overlap each other at least partially. The laser irradiation process may irradiate laser light so that the optical axis of the laser light moves, for example, along a circular course instead of the square course indicated by the arrows 104a, 104b, 104c, and 104d. It is preferable that the irradiation intensity (printing power) of the laser light, the scan speed of the orbiting laser light, and so on be properly adjusted according to the depth of the pit 20 to be formed.

By carrying out the end face polishing process after the dug-down portions 27 are formed in the manner described above, it is possible to appropriately form the pits 20 each having the generally V-shaped section and the desirable diameter and depth as described with reference to FIGS. 3A and 3B. Therefore, according to this example, it is possible to appropriately form the marker 18 (see FIGS. 3A and 3B) which hardly causes the generation of dust.

The reason for setting the diameter (width) of laser light as described above is as follows: For example, if the diameter of laser light is greater than a diameter, to be obtained, of the pit 20 at its edge portion, the diameter of the pit 20 at its edge portion becomes greater than the diameter to be obtained and thus there is a possibility that the distance between the edge portions of the adjacent pits 20 becomes less than 50 μm so that the width of a portion between the pits 20 becomes small to reduce the strength thereof. As described above, when forming the dug-down portion 27 by laser light, the raised portion 28 is formed around the edge thereof. In this event, there is a possibility that the raised portions 28 of the adjacent dug-down portions 27 overlap each other to reduce the strength of a portion therebetween. Further, there is also a possibility that it becomes difficult to control the shape of the pits 20.

On the other hand, if the diameter (width) of laser light is significantly smaller (e.g. ½ or less) than a diameter, to be obtained, of the pit 20 at its edge portion, there is a possibility that the pit 20 with the generally V-shaped section cannot be appropriately formed. FIG. 4B shows an example of the sectional shape of a pit 20 formed when the diameter of laser light is significantly smaller. When forming, as the marker 18, a data matrix having a size like that in this example, if the width of laser light is, for example, about 0.10 mm or 0.15 mm, the sectional shape of the pit 20 after the end face polishing process becomes a generally W-shape, not a generally V-shape, as shown in FIG. 4B, for example. In this case, a projection is formed at the bottom of the round hole 20 and there is a possibility that this projection causes the generation of dust. Further, there is also a possibility that an error occurs at the time of reading the marker 18 due to the influence of this projection. In such a case, the laser light is irradiated in a spiral path such that portions of the spiral path overlap each other at least partially.

In order to form the dug-down portion 27 by laser light irradiation, it is also possible to perform one-shot irradiation of laser light, for example, by focusing the optical axis on the center 32 of the cell 30, without moving it therearound. However, when the dug-down portion 27 is formed by the one-shot irradiation, as compared with the case where the dug-down portion 27 is formed by the irradiation in the orbital paths or the spiral path, the deepest portion of the dug-down portion 27 becomes wider so that the dug-down portion 27 has a shape close to a U-shape.

Figure 5A:
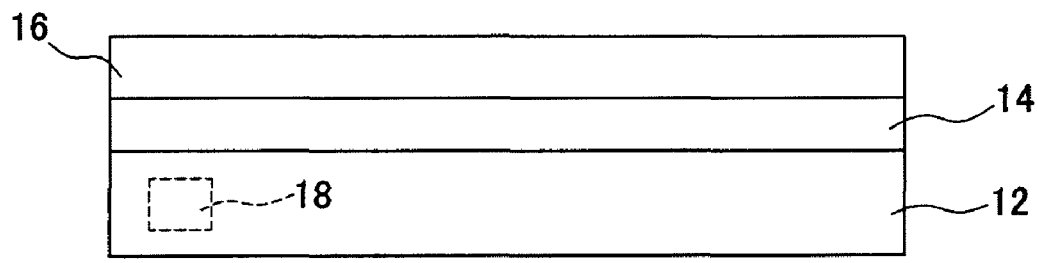
FIG. 5A shows an example of the structure of a mask blank 10 manufactured using the glass substrate 12.
Figure 5B:
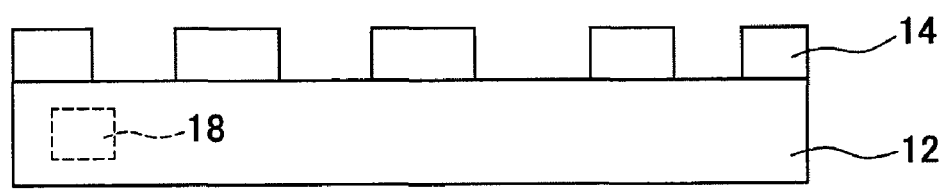
FIG. 5B shows an example of the structure of a mask 50 manufactured using the mask blank 10.

Herein, a description will be given of the structures of a mask blank 10 and a mask 50 manufactured using the glass substrate 12. FIGS. 5A and 5B show examples of the structures of the mask blank 10 and the mask 50, respectively. FIG. 5A shows the example of the structure of the mask blank 10 manufactured using the glass substrate 12. In this example, the mask blank 10 comprises the glass substrate 12, a mask pattern thin film 14, and a resist film 16. The mask pattern thin film 14 is a thin film that will be patterned in the mask manufacturing process, and is formed on the glass substrate 12. The resist film 16 is a resist film that will be used in the patterning of the mask pattern thin film 14, and is formed on the mask pattern thin film 14. According to this example, it is possible to appropriately manufacture the mask blank 10 satisfying the quality that is required when manufacturing the mask 50 for short-wavelength exposure light, for example.

FIG. 5B shows the example of the structure of the mask 50 manufactured using the mask blank 10. In the mask 50, the mask pattern thin film 14 is patterned by photolithography. Further, the resist film 16 in the mask blank 10 is removed after the patterning. According to this example, it is possible to appropriately manufacture the mask 50 suitable for use with exposure light having a short wavelength of 200 nm or less, for example. It is also possible to appropriately manufacture a reflective mask for extreme ultraviolet (EUV) exposure, which is used in reflective lithography using EUV light as a light source.

Hereinbelow, this invention will be described in further detail based on Examples and Comparative Examples.

Example 1

A glass substrate 12 according to Example 1 was manufactured in the same or similar manner as a known mask blank glass substrate manufacturing method except that a laser irradiation process was carried out for forming a marker 18. In this Example, an end face polishing process of polishing an end face of the glass substrate 12 to a predetermined surface roughness was carried out, for example, in the same or similar manner as a known end face polishing process. The laser irradiation process was carried out prior to the end face polishing process. Accordingly, in the end face polishing process, the end face formed with pits 20 by irradiation of laser light was polished to the predetermined surface roughness.

Further, in this Example, in the same or similar manner as the method described with reference to FIGS. 4A and 4B, the laser irradiation process was carried out by adjusting the irradiation intensity and so on of a laser marker and irradiating carbon dioxide laser light having a diameter of 0.08 mm in an effective region having energy enough to melt or sublimate the glass substrate. As the marker 18, a data matrix with a block size of 3 mm×3 mm was formed. In the data matrix, the symbol size was set to 12×12 (fixed: 10 digits). In this case, the cell size was 0.25 mm.

Various settings, such as the laser power and the scan speed, of the laser marker were properly adjusted so that the shape of each pit 20 in the marker 18 became the preferable shape described with reference to FIGS. 2A to 2C and FIGS. 3A and 3B (adjusted so that laser light orbital paths for each dug-down portion 27 partially overlapped each other).

As a result, in Example 1, each pit 20 was formed as a hole being generally circular in plan view and having a generally V-shaped section as shown in FIGS. 3A and 3B. The diameter L1 of each pit 20, forming the marker 18, at its edge portion took a value in a range of 90 to 120 μm (105 μm in average). In this case, the average distance between the edge portions of the adjacent pits 20 was 145 μm. The depth D of each pit 20 was 25 to 40 μm (31 μm in average).

Example 2

A glass substrate 12 according to Example 2 was manufactured in the same manner as in Example 1 except that the diameter of laser light was set to 0.06 mm. Also in Example 2, as in Example 1, each pit 20 was formed as a hole being generally circular in plan view and having a generally V-shaped section. The diameter L1 of each pit 20 at its edge portion and the depth D thereof also fell within substantially the same ranges as those in Example 1.

Example 3

A glass substrate 12 according to Example 3 was manufactured in the same manner as in Example 1 except that various conditions were adjusted so that the average distance between edge portions of adjacent pits 20 became 100 μm (in the laser marker, the diameter of laser light was adjusted to 0.1 mm and various settings such as the laser power and the scan speed were adjusted so that the shape of each pit 20 became the preferable shape as shown in FIGS. 3A and 3B).

As a result, in Example 3, each pit 20 was formed as a hole being generally circular in plan view and having a generally V-shaped section as shown in FIGS. 3A and 3B. The diameter L1 of each pit 20, forming a marker 18, at its edge portion took a value in a range of 145 to 155 μm (150 μm in average). In this case, the average distance between the edge portions of the adjacent pits 20 was 100 μm. The depth D of each pit 20 was 25 to 40 μm (29 μm in average).

Example 4

A glass substrate 12 according to Example 4 was manufactured in the same manner as in Example 1 except that various conditions were adjusted so that the distance between edge portions of adjacent pits 20 became about 50 μm and did not become less than it (in the laser marker, the diameter of laser light was adjusted to 0.15 mm and various settings such as the laser power and the scan speed were adjusted so that the shape of each pit 20 became the preferable shape as shown in FIGS. 3A and 3B).

As a result, in Example 4, each pit 20 was formed as a hole being generally circular in plan view and having a generally V-shaped section as shown in FIGS. 3A and 3B. The diameter L1 of each pit 20, forming a marker 18, at its edge portion took a value in a range of 188 to 200 μm (195 μm in average). In this case, the average distance between the edge portions of the adjacent pits 20 was 52 μm. The depth D of each pit 20 was 25 to 40 μm (31 μm in average).

Comparative Example 1

A glass substrate 12 according to Comparative Example 1 was manufactured in the same manner as in Example 1 except that various conditions were adjusted so that the distance between edge portions of adjacent pits 20 became about 40 μm. In Comparative Example 1, the shape itself of each pit 20 became the same as that in Example 1.

As a result, in Comparative Example 1, each pit 20 was formed as a hole being generally circular in plan view and having a generally V-shaped section as shown in FIGS. 3A and 3B. The diameter L1 of each pit 20, forming a marker 18, at its edge portion took a value in a range of 200 to 215 μm (210 μm in average). In this case, the average distance between the edge portions of the adjacent pits 20 was 43 μm. The depth D of each pit 20 was 25 to 40 μm (31 μm in average).

Example 5

In the same or similar manner as the method described with reference to FIGS. 4A and 4B, a laser irradiation process was carried out by adjusting the irradiation intensity and so on of a laser marker and irradiating carbon dioxide laser light having a diameter of 0.05 mm, thereby forming pits 20. In this event, each pit 20 was formed so that the diameter L1 thereof at its edge portion was about 80 μm and did not become less than it. As a marker 18, a data matrix with a block size of 1.68 mm×1.68 mm was formed. In the data matrix, the symbol size was set to 12×12 (fixed: 10 digits). In this case, the cell size was 0.14 mm.

Various settings, such as the laser power and the scan speed, of the laser marker were properly adjusted so that the shape of each pit 20 in the marker 18 became the preferable shape described with reference to FIGS. 2A to 2C and FIGS. 3A and 3B.

As a result, in Example 5, each pit 20 was formed as a hole being generally circular in plan view and having a generally V-shaped section as shown in FIGS. 3A and 3B. The diameter L1 of each pit 20, forming the marker 18, at its edge portion took a value in a range of 80 to 85 μm (81 μm in average). In this case, the average distance between the edge portions of the adjacent pits 20 was 60 μm. The depth D of each pit 20 was 25 to 40 μm (29 μm in average).

Comparative Example 2

A glass substrate 12 according to Comparative Example 2 was manufactured in the same manner as in Example 5 except that various conditions were adjusted so that the diameter L1 of each pit 20 at its edge portion became about 70 μm. In Comparative Example 2, the shape itself of each pit 20 became the same as that in Example 5.

As a result, in Comparative Example 2, each pit 20 was formed as a hole being generally circular in plan view and having a generally V-shaped section as shown in FIGS. 3A and 3B. The diameter L1 of each pit 20, forming a marker 18, at its edge portion took a value in a range of 70 to 75 μm (72 μm in average). In this case, the average distance between the edge portions of the adjacent pits 20 was 70 μm. The depth D of each pit 20 was 25 to 40 μm (31 μm in average).

Example 6

In the same or similar manner as the method described with reference to FIGS. 4A and 4B, a laser irradiation process was carried out by adjusting the irradiation intensity and so on of a laser marker and irradiating carbon dioxide laser light having a diameter of 0.2 mm, thereby forming pits 20. In this event, each pit 20 was formed so that the diameter L1 thereof at its edge portion was about 250 μm and did not exceed it. As a marker 18, a data matrix with a block size of 3.6 mm×3.6 mm was formed. In the data matrix, the symbol size was set to 12×12 (fixed: 10 digits). In this case, the cell size was 0.3 mm.

Various settings, such as the laser power and the scan speed, of the laser marker were properly adjusted so that the shape of each pit 20 in the marker 18 became the preferable shape described with reference to FIGS. 2A to 2C and FIGS. 3A and 3B.

As a result, in Example 6, each pit 20 was formed as a hole being generally circular in plan view and having a generally V-shaped section as shown in FIGS. 3A and 3B. The diameter L1 of each pit 20, forming the marker 18, at its edge portion took a value in a range of 240 to 250 μm (248 μm in average). In this case, the average distance between the edge portions of the adjacent pits 20 was 52 μm. The depth D of each pit 20 was 25 to 40 μm (32 μm in average).

Example 7

A glass substrate 12 according to Example 7 was manufactured in the same manner as in Example 1 except that various conditions were adjusted so that the average of depths D of pits 20 became 20 μm.

As a result, in Example 7, each pit 20 was formed as a hole being generally circular in plan view and having a generally V-shaped section as shown in FIGS. 3A and 3B. The diameter L1 of each pit 20, forming a marker 18, at its edge portion took a value in a range of 90 to 110 μm (100 μm in average). In this case, the average distance between the edge portions of the adjacent pits 20 was 145 μm. The depth D of each pit 20 was 17 to 23 μm (21 μm in average).

Example 8

A glass substrate 12 according to Example 8 was manufactured in the same manner as in Example 1 except that various conditions were adjusted so that the average of depths D of pits 20 became 10 μm.

As a result, in Example 8, each pit 20 was formed as a hole being generally circular in plan view and having a generally V-shaped section as shown in FIGS. 3A and 3B. The diameter L1 of each pit 20, forming a marker 18, at its edge portion took a value in a range of 90 to 110 μm (100 μm in average). In this case, the average distance between the edge portions of the adjacent pits 20 was 145 μm. The depth D of each pit 20 was 8 to 12 μm (10 μm in average).

Example 9

A glass substrate 12 according to Example 9 was manufactured in the same manner as in Example 1 except that various conditions were adjusted so that the depth D of each pit 20 was about 4 μm and did not become less than it.

As a result, in Example 9, each pit 20 was formed as a hole being generally circular in plan view and having a generally V-shaped section as shown in FIGS. 3A and 3B. The diameter L1 of each pit 20, forming a marker 18, at its edge portion took a value in a range of 90 to 110 μm (100 μm in average). In this case, the average distance between the edge portions of the adjacent pits 20 was 145 μm. The depth D of each pit 20 was 4 to 6 μm (4.3 μm in average).

Comparative Example 3

A glass substrate 12 according to Comparative Example 3 was manufactured in the same manner as in Example 1 except that various conditions were adjusted so that the average of depths D of pits 20 became 3 μm.

As a result, in Comparative Example 3, each pit 20 was formed as a hole being generally circular in plan view and having a generally V-shaped section as shown in FIGS. 3A and 3B. The diameter L1 of each pit 20, forming a marker 18, at its edge portion took a value in a range of 90 to 110 μm (100 μm in average). In this case, the average distance between the edge portions of the adjacent pits 20 was 145 μm. The depth D of each pit 20 was 3 to 4 μm (3.1 μm in average).

Example 10

A glass substrate 12 according to Example 10 was manufactured in the same manner as in Example 1 except that various conditions were adjusted so that the depth D of each pit 20 was about 50 μm and did not exceed it.

As a result, in Example 10, each pit 20 was formed as a hole being generally circular in plan view and having a generally V-shaped section as shown in FIGS. 3A and 3B. The diameter L1 of each pit 20, forming a marker 18, at its edge portion took a value in a range of 90 to 110 μm (100 μm in average). In this case, the average distance between the edge portions of the adjacent pits 20 was 145 μm. The depth D of each pit 20 was 45 to 50 μm (49 μm in average).

Comparative Example 4

A glass substrate 12 according to Comparative Example 4 was manufactured in the same manner as in Example 1 except that various conditions were adjusted so that the average of depths D of pits 20 became 55 μm.

As a result, in Comparative Example 4, each pit 20 was formed as a hole being generally circular in plan view and having a generally V-shaped section as shown in FIGS. 3A and 3B. The diameter L1 of each pit 20, forming a marker 18, at its edge portion took a value in a range of 90 to 110 μm (100 μm in average). In this case, the average distance between the edge portions of the adjacent pits 20 was 145 μm. The depth D of each pit 20 was 53 to 58 μm (56 μm in average).

(Evaluation)

100 glass substrates 12 were manufactured for each of Examples 1 to 10 and Comparative Examples 1 to 4 and a substrate inspection for checking the presence or absence of a defect such as a crack or a chip in the marker 18 was conducted on the basis of a standard required when the glass substrate 12 was used in the manufacture of a mask for ArF excimer laser (wavelength: 193 nm) exposure. Further, a marker read inspection using a marker reader was also conducted. For Examples 1 to 10, the inspection results were such that all the glass substrates 12 passed the inspections. On the other hand, for Comparative Example 1, part (15) of the glass substrates 12 failed. This is presumably because, in Comparative Example 1, the distance between the edge portions of the adjacent pits 20 was as small as 40 µm and thus cracks or chips occurred due to shock or the like in the end face polishing process, for example.

For Comparative Example 2, part (30) of the glass substrates 12 failed the marker read inspection. This is presumably because the average of the diameters L1 of the pits 20 at their edge portions was as small as 72 µm and thus the contrast between the pits 20 and other portions in the marker 18 became insufficient so that there appeared portions where the marker reader could not recognize the pits 20.

For Comparative Example 3, about half the glass substrates 12 failed the marker read inspection. This is presumably because the average of the depths D of the pits 20 was as small as 3.1 µm and thus the contrast between the pits 20 and other portions in the marker 18 became insufficient so that there frequently appeared portions where the marker reader could not recognize the pits 20.

For Comparative Example 4, part (8) of the glass substrates 12 failed the substrate inspection. This is presumably because the average of the depths D of the pits 20 was as great as 56 µm and thus dust generated in the formation of the pits 20 (the laser irradiation process or the end face polishing process) or the like adhered in the pits 20 and could not be fully removed in a cleaning process.

Reference Examples 1 and 2

A glass substrate 12 according to Reference Example 1 was manufactured in the same manner as in Example 1 except that the diameter of laser light was set to 0.04 mm and that the diameter of each pit 20 at its edge portion was set to about 100 µm and the laser light was moved only in a single orbital path about the center of each pit 20 to be formed. Further, a glass substrate 12 according to Reference Example 2 was manufactured in the same manner as in Example 1 except that the printing line width of laser light, i.e. the diameter of the laser light, was set to 0.04 mm and the laser light was moved in a spiral path portions of which partially overlapped each other.

In Reference Example 1, the diameter of the laser light was half or less the width of the pit 20 to be formed and, therefore, with the movement of the laser light only in the single orbital path, portions of the orbital path did not overlap each other and thus the central portion of the pit 20 was not sufficiently dug down so that the pit 20 did not become a hole having a generally V-shaped section, but became a hole having a generally W-shaped section. Accordingly, it was not possible to appropriately form the pit 20 having the preferable shape described with reference to FIGS. 2A to 2C and FIGS. 3A and 3B.

On the other hand, in Reference Example 2, although the diameter of the laser light was half or less the width of the pit 20 to be formed, since the laser light was moved in the spiral path portions of which partially overlapped each other, the central portion of the pit 20 was sufficiently dug down so that the pit 20 became a hole having a generally V-shaped section. Accordingly, it was possible to appropriately form the pit 20 having the preferable shape described with reference to FIGS. 2A to 2C and FIGS. 3A and 3B.

While this invention has been described in terms of the embodiment, the technical scope of this invention is not limited thereto. It is readily understood by a person skilled in the art that various modifications or improvements can be added to the foregoing embodiment. It is apparent from the description of the claims that the modes added with those modifications or improvements can also be included in the technical scope of this invention.

What is claimed is:

1. A mask blank glass substrate for use in manufacturing a mask blank, wherein:
    a marker expressing, by a plurality of pits, information for identifying or managing the mask blank glass substrate is formed on an end surface of the mask blank glass substrate,
    each of the pits forming the marker is a round hole with its edge portion being generally circular, each pit being the round hole with its depth gradually increasing from its edge portion toward a deepest portion at its center, each pit having a depth of 4 to 50 µm,
    a diameter of each pit at its edge portion is 80 µm or more, and
    a distance between the edge portions of the adjacent pits is 50 µm to 170 µm.

2. The mask blank glass substrate according to claim 1, wherein:
    the marker is a two-dimensional code in which cells having a cell size of 0.13 to 0.3 mm are arranged two-dimensionally and which indicates the information by forming the pits in predetermined cells, and
    a diameter of each pit at its edge portion is 250 µm or less.

3. The mask blank glass substrate according to claim 1, wherein:
    the mask blank glass substrate is made of synthetic quartz glass or low thermal expansion glass.

4. A method of manufacturing a mask blank glass substrate for use in manufacturing a mask blank, wherein:
    a marker expressing, by a plurality of pits, information for identifying or managing the mask blank glass substrate is formed on an end surface of the mask blank glass substrate,
    each of the pits forming the marker is a round hole with its edge portion being generally circular, each pit being the round hole with its depth gradually increasing from its edge portion toward a deepest portion at its center, each pits having a depth of 4 to 50 µm,
    a diameter of each pit at its edge portion is 80 µm or more,
    a distance between the edge portions of the adjacent pits is 50 µm to 170 µm, and
    the method, comprising;
    a laser irradiation step of irradiating laser light to form a dug-down portion, and
    a polishing step of polishing an end face including a raised portion formed around the dug-down portion to form the pit.

5. The method according to claim 4, wherein:
    the marker is a two-dimensional code in which cells having a cell size of 0.13 to 0.3 mm are arranged two-dimensionally and which indicates the information by forming the pits in predetermined cells, and a diameter of each pit at its edge portion is 250 µm or less,
    the laser irradiation step using laser light having a diameter equal to or less than the diameter of the pit at its edge portion, and moving said laser light in orbital paths or in a spiral path about the center of the pit such that the orbital paths or portions of the spiral path overlap each other at least partially, thereby forming the dug-down portion which is to be the pit.

6. A method of manufacturing a mask blank for use in manufacturing a mask for photolithography, the method comprising:
 preparing the mask blank glass substrate manufactured by the method according to claim 4, and
 forming a transfer pattern thin film on the mask blank glass substrate.

7. A method of manufacturing a mask for photolithography, the method comprising:
 preparing the mask blank manufactured by the method according to claim 6, and
 patterning the transfer pattern thin film.

8. The method according to claim 4, wherein:
 the mask blank glass substrate is made of synthetic quartz glass or low thermal expansion glass.

9. A mask blank for use in manufacturing a mask for photolithography, wherein:
 a marker expressing, by a plurality of pits, information for identifying or managing a mask blank glass substrate is formed on an end surface of the mask blank glass substrate,
 each of the pits forming the marker is a round hole with its edge portion being generally circular, each pit being the round hole with its depth gradually increasing from its edge portion toward a deepest portion at its center, each pits having a depth of 4 to 50 μm,
 a diameter of each pit at its edge portion is 80 μm or more, and
 a distance between the edge portions of the adjacent pits is 50 μm to 170 μm.

10. The mask blank according to claim 9, wherein:
 the mask blank glass substrate is made of synthetic quartz glass or low thermal expansion glass, and
 a transfer pattern film is formed on the mask blank glass substrate.

11. A mask for photolithography, wherein:
 a marker expressing, by a plurality of pits, information for identifying or managing a mask blank glass substrate is formed on an end surface of the mask blank glass substrate,
 each of the pits forming the marker is a round hole with its edge portion being generally circular, each pit being the round hole with its depth gradually increasing from its edge portion toward a deepest portion at its center, each pits having a depth of 4 to 50 μm,
 a diameter of each pit at its edge portion is 80 μm or more, and
 a distance between the edge portions of the adjacent pits is 50 μm to 170 μm.

12. The mask according to claim 11, wherein:
 the mask blank glass substrate is made of synthetic quartz glass or low thermal expansion glass, and
 a transfer pattern film is formed on the mask blank glass substrate.

\* \* \* \* \*